United States Patent [19]

Liguori et al.

[11] Patent Number: 4,996,630
[45] Date of Patent: Feb. 26, 1991

[54] HYBRID MODULE ELECTRONICS PACKAGE

[75] Inventors: Ralph Liguori, Oakland; Kurt R. Goldhammer, West Milford; Lothar Laermer, Paramus, all of N.J.

[73] Assignee: Plessey Electronic Systems Corp., Wayne, N.J.

[21] Appl. No.: 413,432

[22] Filed: Sep. 27, 1989

[51] Int. Cl.$^5$ .............................................. H05K 1/11
[52] U.S. Cl. ................................... 361/412; 361/424
[58] Field of Search ...................... 174/35 MS, 35 R; 361/414, 424

[56] References Cited

U.S. PATENT DOCUMENTS

| | | | |
|---|---|---|---|
| 4,372,037 | 2/1983 | Scapple et al. | 29/613 |
| 4,494,095 | 1/1985 | Noji et al. | 361/424 |
| 4,642,735 | 2/1987 | Hodsdon et al. | 361/424 |
| 4,724,283 | 2/1988 | Shimada et al. | 361/414 |
| 4,734,315 | 3/1988 | Spence-Bate | 361/414 |
| 4,736,266 | 4/1988 | Tanibe | 361/414 |
| 4,736,276 | 4/1988 | Ushifusa et al. | 361/414 |
| 4,811,165 | 3/1989 | Currier et al. | 361/386 |

OTHER PUBLICATIONS

R. A. Rinne et al.; "Multi-Chip Module Technology", presented at CHMT Symposium, Oct. 1-3, 1984, Tokyo, Japan.
T. Watari et al.; "Packaging Technology for the NEC SX Supercomputer", presented at Elec. Components Conf., May 20-22, 1985, Washington, DC.
J. K. Hagge; "Ultra-Reliable HWSI with Aluminiun Nitride Packaging", presented at Nepcon West, Mar. 1989, Anaheim, Calif.
K. P. Shambrook et al.; "High-Density Multichip Interconnect", presented at Elec. Components Conf., May 22-24, 1989, Houston, Tex.
S. Sasaki et al., "A New Multi-Chip Module Using a Copper Polyimide Multi-Layer Substrate", presented at Elec. Components Conf., 5/22-24/89 Houston Tex.
T. G. Tessier et al., "Polymer Dielectric Options for Thin Film Packaging Applications", presented at Elec. Components Conf., 5/22-24/89, Houston, Tex.

*Primary Examiner*—Gregory D. Thompson
*Attorney, Agent, or Firm*—David L. Davis

[57] ABSTRACT

A Very Large Hybrid Module (VLHM) for packaging electronic components provides a hermetic enclosure formed by a hermetic substrate on which the components are mounted together with a hermetic lid surrounding groups of the components. A second substrate outside the hermetic enclosure is utilized for providing connections between the electronic components.

8 Claims, 4 Drawing Sheets

HYBRID MODULE ELECTRONICS PACKAGE

BACKGROUND OF THE INVENTION

This invention relates to the packaging of electronic components and, more particularly, to an improved very large hybrid module having high density and high performance characteristics.

In recent years, there have been rapid advances in the development of very large scale and very high speed integrated circuits. This has led to integrated circuit chips of ever increasing sizes, which has been accompanied by a dramatic increase in the required number of input/output leads to the chips. At the same time, the increased functional density has resulted in a corresponding increase in power dissipation requirements. While these developments are generally desirable, problems arise because conventional single chip packaging techniques do not offer interconnection systems compatible with high speed operation nor do they offer a heat removal mechanism which is required for the high power densities achieved by these new integrated circuit chips. At the present time, integrated circuit chips are typically packaged in individual cases which in turn are mounted to, and interconnected via, printed circuit boards. The increases in the functional capability and the input/output count of these chips continues to enlarge the chip package and the required packaging real estate. Typically, a two inch square is needed for a 256 input/output pin grid array.

As the size of integrated circuit chip packages increases, the distance between the chips lengthens, the complexity of the printed circuit board rises, and high speed operation deteriorates. The larger packages also have cumbersome thermal interfaces with high impedance thermal paths.

To overcome interconnection length problems, the semiconductor industry has developed large multi-chip packages which employ thick or thin film interconnect technology, thereby eliminating individual chip packages. As a means of further improving interconnections and bringing the chips into closer proximity, the chips are often mounted on a multi-layer fine line polyimide dielectric. Thus, packages as large as four inches square and containing in excess of 100 chips in a single hermetic enclosure have been developed.

Although the individual chips are tested prior to mounting on the dielectric, testing is difficult once the chips are bonded to the dielectric. Probing a field cluttered with wire bonds or TAB connections can lead to subtle and not readily detectable damage, possibly initiating a long term failure mechanism. After the lid of the hermetic enclosure is sealed, the removal of the lid, or impervious coatings, for repair purposes and subsequent resealing pose significant problems.

A further problem with the aforedescribed arrangement is that when chips are mounted on an organic dielectric substrate, additional thermal impedance is introduced and there is a potential outgassing and ionic contamination problem from the dielectric substrate within the hermetic enclosure.

An alternative to multi-chip packaging is wafer scale integration wherein a two to four inch diameter wafer is mounted within a hermetic enclosure or under an impervious overcoat. This approach goes a long way toward minimizing lead length, but results in poor yields, testability problems and high "up front" cost.

Another recently developed packaging technique which aspires to provide hermetically equivalent environmental protection by using a topical passivation or overcoat results in weight savings and size advantages. However, cleanliness and ionic or moisture penetration represent formidable challenges.

It is therefore a primary object of this invention to provide a cost effective chip package which resolves all of the aforedescribed outstanding problems while conforming to established industry standards for overall size and shape.

A more specific object of this invention is to provide an integrated circuit chip module capable of interconnecting a multitude of high speed devices, each having as many as several hundred input/output connections.

A further object of this invention is to provide such a module with an appropriate heat removal mechanism.

Yet another object of this invention is to provide such a module with dense hermetic packaging of a number of integrated circuit chips.

It is still a further object of this invention to provide such a module wherein the interconnection system facilitates reliable chip to chip communication at greater than a 100 megahertz rate within a limited area, with localized sections being able to accommodate higher frequency circuitry utilizing GaAs chips operating at gigahertz rates.

It is yet another object of this invention to provide such a module where the interconnection medium does not introduce detrimental outgassing into the hermetic enclosure.

Still a further object of this invention is to provide a module which permits electrical signal access to every one of the chip input/output pads from the outside of the hermetic enclosure for rapid in-circuit electrical testing after sealing of the hermetic enclosure, with the hermetic enclosure design being able to accommodate a reasonable number of unseal/seal cycles. Further, it is desired to have the capability of external cut and jumper reworkability of the package.

SUMMARY OF THE INVENTION

The foregoing, and additional, objects are attained in accordance with the principles of this invention by providing a module of electronic circuitry comprising a first substrate having hermetic properties and having generally planar parallel first and second surfaces, a plurality of electronic components mounted on the first surface of the first substrate, the plurality of components being grouped within discrete regions of the first surface, enclosure means for providing a plurality of hermetic enclosures on the first surface, each of the enclosures surrounding the components within a respective discrete region, a second substrate having generally planar parallel first and second surfaces with the first surface of the second substrate being in intimate contact with and electrically interconnected to the second surface of the first substrate, and interconnection means for providing connections between the plurality of electronic components through the second substrate.

In accordance with an aspect of this invention, the enclosure means includes a plurality of hermetic seal rings hermetically mounted on the first substrate first surface, each of the seal rings surrounding a respective discrete region, and a plurality of hermetic lid members each hermetically joined to a respective one of the seal rings so as to provide a plurality of enclosed spaces each containing the electronic components within the respective discrete region.

In accordance with another aspect of this invention, the first substrate is formed of a ceramic, which may be a co-fired ceramic, and which is selected from a group consisting of aluminum oxide and aluminum nitride or other insulating material having similar physical properties.

In accordance with a further aspect of this invention, the second substrate is formed from a polymer material.

In accordance with still a further aspect of this invention, the interconnection means includes a plurality of conductive pads on the first substrate first surface, means for electrically connecting the leads of the electronic components to respective ones of the pads, a first plurality of metallized vias through the first substrate in contact with respective ones of the pads, with the first plurality of vias extending from the first surface to the second surface of the first substrate, and a plurality of conductive signal traces through the second substrate interconnecting the first plurality of vias so as to provide a desired pattern of connections between the leads of the electronic components.

In accordance with still another aspect of this invention, the module further includes a second plurality of metallized vias through the second substrate, the second plurality of vias being in contact with respective ones of the first plurality of vias and extending from the first surface to the second surface of the second substrate.

In accordance with yet another aspect of this invention, the second substrate and the plurality of conductive signal traces are together formed as a multi-layer conductor/polymer substrate.

BRIEF DESCRIPTION OF THE DRAWINGS

The foregoing will be more readily apparent upon reading the following description in conjunction with the drawings in which like elements in different figures have the same reference numeral and wherein.

DETAILED DESCRIPTION

Figure 1:
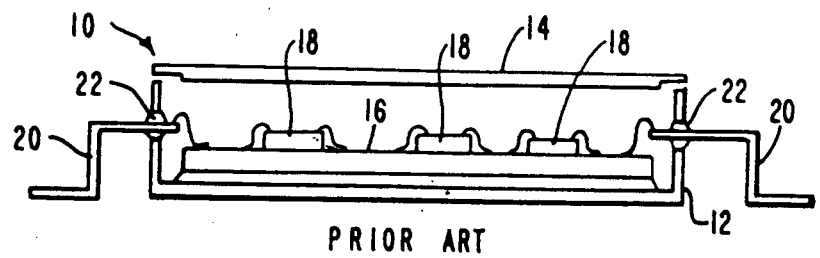
FIG. 1 schematically depicts a cross section of a typical prior art hybrid package.

FIG. 1 schematically illustrates a cross-section of a typical prior art hybrid package, designated generally by the reference numeral 10. The package 10 includes a case 12, typically formed of Kovar alloy, to which is metallurgically joined a lid 14 to form a hermetic enclosure. A ceramic substrate 16 is bonded to the case 12 and has mounted thereon a plurality of semiconductor chips 18 which are wire bonded to signal traces (not shown) on the surface of the substrate 16 in a conventional manner. To provide input/output connections to and from the chips 18, appropriate ones of the signal traces are wire bonded to leads 20. The leads 20 pass through the case 12 via glass-to-metal seals 22 in order to maintain the hermeticity of the package 10. The leads 20 are then prepared for subsequent solder attachment to a printed wiring board.

Known disadvantages of the aforedescribed type of package include a limit to the allowable number of input/output connections leaving the hermetic enclosure for a given package size. Further, the interconnection seals are a significant source of hermetic seal failure. Another problem is that reworking and repairing the hybrid circuit is difficult and there is a limit to the testing and fault isolation which ca be performed after sealing of the package. Still further, the substrate typically possesses poor electrical characteristics, especially regarding high speed transmission and shielding.

Figure 2:
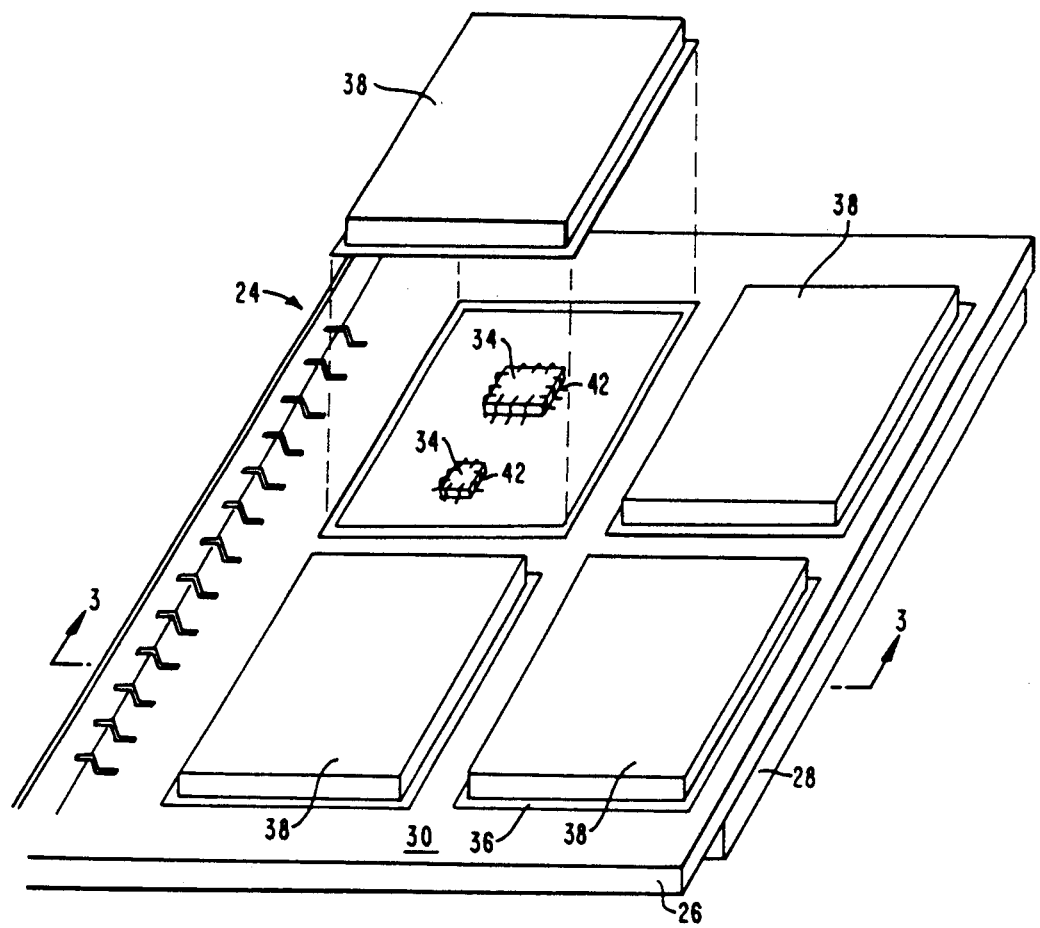
FIG. 2 is a partially exploded perspective view of a package constructed in accordance with the principles of this invention.
Figure 3:
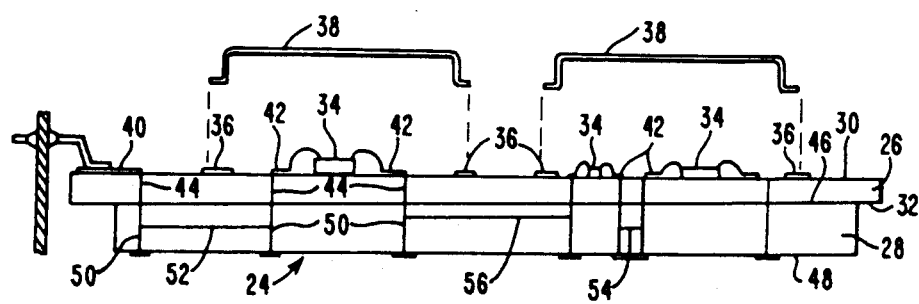
FIG. 3 schematically depicts a partially exploded cross sectional view through the package of FIG. 2, taken along the line 3—3.

To overcome the aforenoted disadvantages, the very large hybrid module package depicted in FIGS. 2 and 3 was developed. This package, designated generally by the reference numeral 24, utilizes a dual substrate approach. As will be described in full detail hereinafter, the first substrate is used for mounting the electronic components, attaching the lid, and providing part of the hermetic barrier. The second substrate is outside the hermetic closure and is used for providing interconnections between the electronic components.

As shown in the drawings, the package 24 includes a first substrate 26 and a second substrate 28. In accordance with this invention, the first substrate 26 has hermetic properties and is generally planar with parallel first and second surfaces 30 and 32, respectively. The first surface 30 has a plurality of electronic components 34 mounted thereon, the electronic components 34 being grouped within discrete regions of the first surface 30. Each of the regions is surrounded by a seal ring 36 which is hermetically mounted on the surface 30. Hermetically joined to each of the seal rings 36 is a hermetic lid member 38. Accordingly, all of the electronic components 34 mounted within a discrete region are contained within a hermetic enclosure, formed by the first substrate 26, a respective seal ring 36, and a respective lid member 38.

As mentioned above, the first substrate 26 provides a hermetic barrier. Preferably, the substrate 26 is formed of a ceramic. More particularly, the substrate 26 is actually several co-fired layers of ceramic with metallization. Preferred ceramics are aluminum oxide and aluminum nitride. On the surface 30 of the substrate 26, there are various areas of metallization. These include input-/output connector lands 40, component interconnect pads 42 to which the leads of the components 34 are electrically connected, as well as the seal rings 36. A majority of interconnections between these areas of metallization are effected through the second substrate 28, although the first substrate 26 may contain internal power and/or ground planes and/or some functional interconnect. Accordingly, the first substrate 26 has a first plurality of metallized vias 44 extending therethrough from the first surface 30 to the second surface 32. These vias 44 are in electrical contact with the areas of metallization on the first surface 30. The vias 44 illustratively are formed during the co-firing of the ceramic substrate 26. Alternatively, the vias could be formed by laser drilling and subsequent metallization of pre-fired ceramic.

The second substrate 28 is generally planar with parallel first and second surfaces 46 and 48, respectively. The first surface 46 of the second substrate 28 is in intimate contact with the second surface 32 of the first substrate 26. A second plurality of metallized vias 50 extend from the first surface 46 to the second surface 48 of the second substrate 28 and are, in effect, extensions of the first plurality of metallized vias 44. To effect a desired connection pattern between the electronic components 34, the second substrate 28 is formed with conductive signal traces between appropriate ones of the second plurality of metallized vias 50. Thus, to effect connections to the input/output connector lands 40, input/output signal traces 52 are provided. To make connections between electronic components within a discrete region, intra-region signal traces 54 of minimized interconnect length are provided. Finally, to make connections between electronic components in different regions, inter-region signal traces 56 are provided.

Figure 4A:
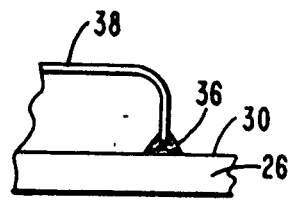
FIGS. 4A–4E illustrate alternate configurations of sealing arrangements.
Figure 4B:
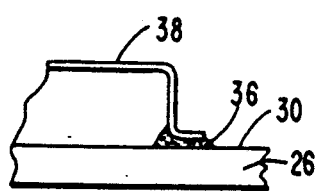
Figure 4C:
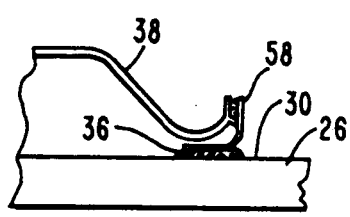
Figure 4D:
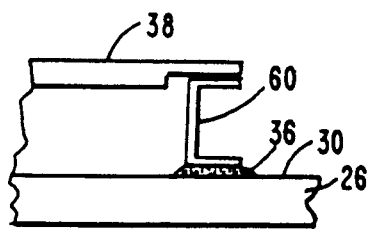
Figure 4E:
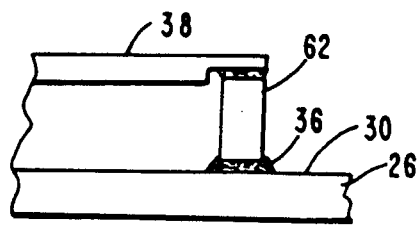

FIGS. 4A-4E illustrate alternative configurations for the lid 38 joined to the metallized seal ring 36 on the surface 30. FIG. 4A shows a deep drawn lid 38 without a flange that is soldered to the seal ring 36. FIG. 4B shows a deep drawn lid 38 with a flange that is soldered to the seal ring 36. In FIGS. 4C, 4D and 4E, intermediate seal ring members 58, 60 and 62, respectively, are brazed to the seal ring 36 and are then joined to the lid 38 by solder or a weld.

Figure 5A:
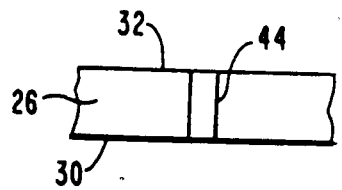
FIGS. 5A–5G schematically depict the steps for an exemplary multi-layer conductor/polymer substrate fabrication.
Figure 5B:
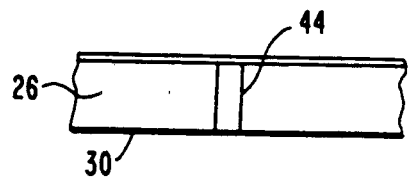
Figure 5C:
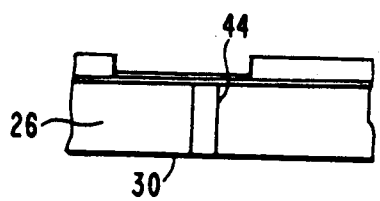
Figure 5D:
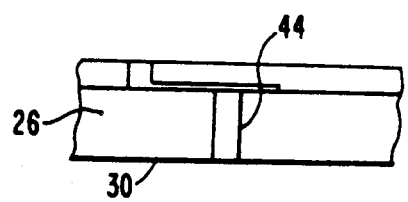
Figure 5E:
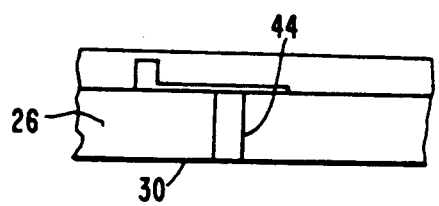
Figure 5F:
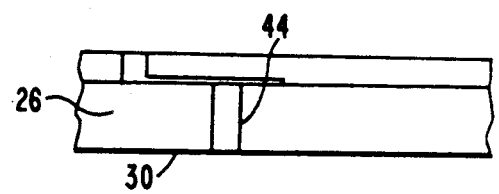
Figure 5G:
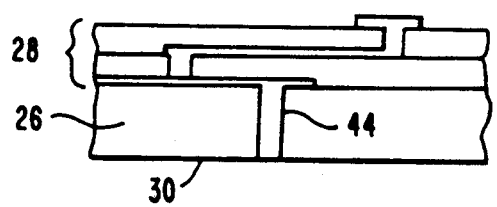

FIGS. 5A-5G illustrate the steps for forming the second substrate 28 using a plated post via method. As shown in FIG. 5A, initially the first substrate 26 is obtained and placed with the component mounting surface 30 on the bottom. Next, as shown in FIG. 5B, a conductive adhesion layer is sputtered to the surface 32. As shown in FIG. 5C, photoresist is applied and patterned, and the via pads are plated. As shown in FIG. 5D, the resist is removed, photoresist is applied and patterned, and the via posts are plated. As shown in FIG. 5E, the resist is removed, the adhesion layer is etched, liquid polymer is spin coated on the surface, and the polymer is cured. As shown in FIG. 5F, the polymer surface is "planarized" by a lapping process to expose the via posts. As shown in FIG. 5G, the aforedescribed steps are repeated to build additional layers.

Figure 6A:
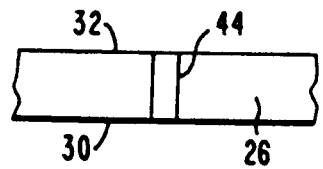
FIGS. 6A–6H schematically depict the steps for an alternate multi-layer conductor/polymer substrate fabrication.
Figure 6B:
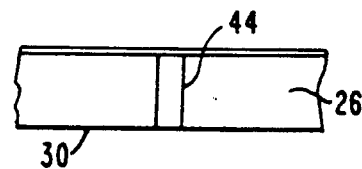
Figure 6C:
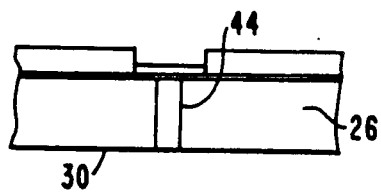
Figure 6D:
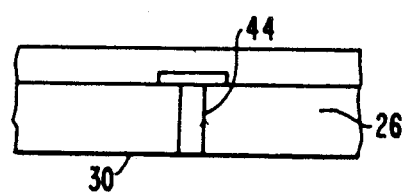
Figure 6E:
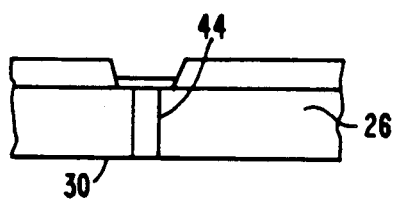
Figure 6F:
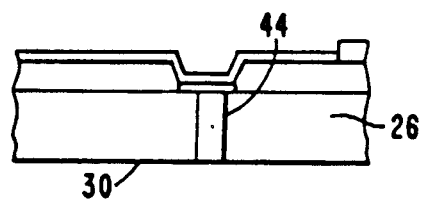
Figure 6G:
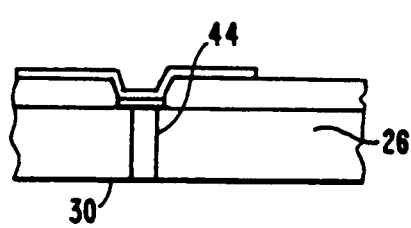
Figure 6H:
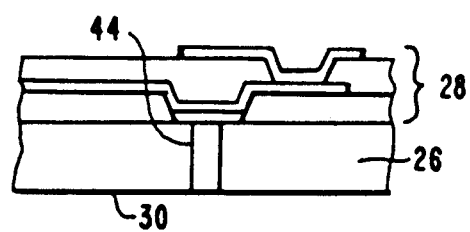

FIGS. 6A-6H illustrate the steps in obtaining an etched via substrate 28. As shown in FIG. 6A, initially the first substrate 26 is placed with its component mounting surface 30 on the bottom. As shown in FIG. 6B, a conductive adhesion layer is sputtered onto the surface 32. As shown in FIG. 6C, photoresist is applied and patterned, and the via pads are plated. As shown in FIG. 6D, the resist is removed, the adhesion layer is etched, liquid polymer is spin coated on the surface, and the polymer is cured. As shown in FIG. 6E, the vias are either reactive ion etched (RIE) or laser drilled. As shown in FIG. 6F, an adhesion layer is then sputtered onto the surface. As shown in FIG. 6G, photoresist is applied and patterned, and a conductor pattern is plated. As shown in FIG. 6H, the aforedescribed steps are repeated to build additional layers for the substrate 28.

In accordance with this invention, the second plurality of metallized vias 50 are exposed at the second surface 48 of the second substrate 28. Accordingly, after the components 34 are mounted on the surface 30, the module may be electrically tested from the surface 48. Then, the hermetic lid members 38 are sealed the module is re-tested from the second surface 48. If a component is found to be defective, the appropriate lid 38 can be removed, the component replaced, and the lid re-sealed. Furthermore, if it is desired to change the interconnection pattern, the second substrate 28 is accessible so that the signal traces can be cut and jumpers installed, all without requiring removal of the lid members 38. After all testing has been performed and any desired changes to the interconnection pattern have been effected, the second surface 48 may have an insulating overcoat applied.

Accordingly, there has been disclosed an improved hybrid module electronics package. While illustrative embodiments of the present invention have been disclosed herein, it will be apparent to those of ordinary skill in the art that various modifications and adaptations to those embodiments are possible and it is only intended that the present invention be limited by the scope of the appended claims.

We claim:

1. A hybrid module of electronic circuitry comprising:
    a first substrate having hermetic properties, said first substrate having generally planar parallel first and second surfaces;
    a plurality of electronic components mounted on the first surface of said first substrate, said plurality of components being grouped within discrete regions of said first surface;
    enclosure means for providing a plurality of hermetic enclosures on said first surface, each of said hermetic enclosures surrounding the components within a respective discrete region;
    a second substrate having organic properties, said second substrate having generally planar parallel first and second surfaces, the first surface of said second substrate being in intimate contact with and electrically interconnected to the second surface of said first substrate; and
    interconnection means for providing connections between said plurality of electronic components through said second substrate so that testing of said electronic components can be effected without invasion said hermetic enclosures.

2. A module according to claim 1 wherein said enclosure means includes:
    a plurality of hermetic seal rings hermetically mounted on said first substrate first surface, each of said seal rings surrounding a respective discrete region; and
    a plurality of hermetic lid members each hermetically joined to a respective one of said seal rings so as to provide a plurality of enclosed spaces each containing the electronic components within a respective discrete region.

3. A module according to claim 1 wherein said first substrate is formed of a ceramic.

4. A module according to claim 3 wherein said ceramic is a co-fired ceramic.

5. A module according to claim 4 wherein said ceramic is selected from the group consisting of aluminum oxide and aluminum nitride.

6. A module according to claim 1 wherein said organic material is a polymer.

7. A module according to claim 1 wherein said interconnection means includes:
    a plurality of conductive pads on said first substrate first surface;
    means for electrically connecting the leads of said electronic components to respective ones of said pads;

a first plurality of metallized vias through said first substrate in contact with respective ones of said pads, said first plurality of vias extending from said first surface to said second surface of said first substrate;

a second plurality of metallized vias through said second substrate, said second plurality of vias being in contact with respective ones of said first plurality of vias and extending from said first surface to said second surface of said second substrate; and a plurality of conductive signal traces through said second substrate interconnecting said second plurality of vias so as to provide a desired pattern of connections between the leads of said electronic components.

8. A module according to claim 7 wherein said second substrate, said plurality of conductive signal traces and said second plurality of metallized vias are together formed as a multi-layer conductor/polymer substrate.

* * * * *